(12) United States Patent
Satoh

(10) Patent No.: US 6,271,734 B1
(45) Date of Patent: Aug. 7, 2001

(54) PIEZOELECTRIC OSCILLATOR

(75) Inventor: Tomio Satoh, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 09/506,466

(22) Filed: Feb. 17, 2000

(30) Foreign Application Priority Data

Feb. 26, 1999 (JP) ................................. 11-049227

(51) Int. Cl.[7] ............... H03B 5/04; H03B 5/32; H03B 5/36
(52) U.S. Cl. ............. 331/109; 331/116 R; 331/116 FE; 331/158; 331/175; 331/183; 331/186
(58) Field of Search ............... 331/109, 116 R, 331/116 FE, 117 R, 117 FE, 158, 175, 176, 183, 182, 186, 185

(56) References Cited

U.S. PATENT DOCUMENTS 3,213,390 * 10/1965 Faith et al. ........................... 331/109
3,982,210 * 9/1976 Gehrke ................................. 331/109
4,193,046 * 3/1980 Chiba .................................. 331/109

* cited by examiner

Primary Examiner—David Mis
(74) Attorney, Agent, or Firm—Koda & Androlia

(57) ABSTRACT

A piezoelectric oscillator which is excellent in noise characteristic and aging characteristic is implemented by a piezoelectric oscillator comprising: a Colpitts oscillator including a piezoelectric resonator and an oscillation transistor; amplification means for amplifying an output of the Colpitts oscillator; and rectification means for rectifying an output of the amplification means, an output of the rectification means being fed back to base of the oscillation transistor to keep an oscillation output level constant, in which a base bias is set so as to provide the oscillation transistor with an operation point located in the vicinity of a saturation region, and in which a feedback current from the rectification means is supplied to the base of the oscillation resistor so as to make the operation point approach to the saturation region when the saturation output level has become high and so as to make the operation point go away from the saturation region when the oscillation output level has become low. As a result, a piezoelectric oscillator, which is excellent in both noise characteristic and aging characteristic, is realized.

7 Claims, 2 Drawing Sheets

PIEZOELECTRIC OSCILLATOR

BACKGROUND OF THE INVENTION

1. Field of the Invention

The present invention relates to a piezoelectric oscillator, and in particular to a piezoelectric oscillator which is excellent in noise characteristic and aging characteristic.

2. Description of the Related Art

As a crystal oscillator used in reference signal sources of communication devices, one having a circuit configuration as shown in FIG. 3 is known.

In FIG. 3, a circuit 101 surrounded by a broken line is a typical Colpitts oscillation circuit. A crystal resonator 102 is connected to base of a transistor 103. The base of the transistor 103 is connected to its emitter via a capacitor 104. The emitter of the transistor 103 is connected to ground via a parallel circuit of a capacitor 105 and a resistor 106. Collector of the transistor 103 is connected to a power supply Vcc. Furthermore, one terminal of the crystal resonator 102 is connected to ground via a series circuit of a capacitor 107 and a trimmer capacitor 108.

Incidentally, oscillation output is taken out from ends of the trimmer capacitor 108.

Further, an amplification circuit 109 surrounded by a broken line in FIG. 3 forms a part of an AGC circuit in conjunction with a rectification circuit described later. Emitter of a transistor 110 is connected to ground. Collector of the transistor 110 is connected to the power supply Vcc via a resistor 111. The collector of the transistor 110 is connected to its base via a resistor 112. Furthermore, the base of the transistor 110 is connected to the emitter of the transistor 103 via a capacitor 113.

Furthermore, a circuit 114 surrounded by a broken line in FIG. 3 is the above described rectification circuit. Anode of a diode 115 is connected to cathode of a diode 116. Cathode of the diode 115 is connected to ground. Anode of the diode 116 is connected to the power supply Vcc via a resistor 117. The anode of the diode 116 is connected to ground via a capacitor 118. The cathode of the diode 116 is connected to the collector of the transistor 110 via a capacitor 119. The anode of the diode 116 is connected to the base of the transistor 103 via a resistor 120 in a feedback form.

Incidentally, a capacitor 122 shown in FIG. 3 is a bypass capacitor.

Operation of the crystal oscillator having such a configuration will now be described.

Since the oscillation circuit 101 is a typical Colpitts oscillation circuit as described above, description thereof will be omitted.

An output signal produced from the emitter of the transistor 103 on the basis of parameters of the oscillation circuit 101 is supplied to the amplification circuit 109, amplified therein to a required level, and then generated from the collector of the transistor 110.

The output signal amplified in the amplification circuit 109 is supplied to the diode 115 and the diode 116 of the next stage via the capacitor 119.

A signal component of half a cycle of plus side of the output signal supplied to the rectification circuit 114 flows through the diode 115, and the capacitor 119 is charged with electric charge so that the anode side of the diode 115 will have a lower potential. A signal component of half a cycle of minus side of the output signal supplied to the rectification circuit 114 flows through the diode 116. At the anode of the diode 116, therefore, there is generated a potential equivalent to the sum of the potential generated by the signal component in the half cycle of minus side and the potential generated by the charged electric charge of the capacitor 119. The resultant potential is applied to the base of the transistor 103 included in the oscillation circuit 101.

In this way, the base potential is changed by the control of the AGC circuit. As a result, the collector output of the transistor 103 changes.

When the level of the output signal of the oscillation circuit 101 becomes high, the difference (p—p value) between a minimum value and a maximum value of a signal supplied from the amplification circuit 109 to the rectification circuit 114 increases, and the absolute value of the potential of negative polarity generated on output of the rectification circuit 114 increases. Therefore, the base bias voltage of the transistor 103 falls, and the level of the output signal of the oscillation circuit 101 falls.

On the other hand, in the case where the level of the output signal of the oscillation circuit 101 has fallen, operation opposite to the above-described operation is caused. Therefore, description of its operation will be omitted.

By conducting the above-described operation repetitively, therefore, the crystal oscillator outputs a stable level signal on the basis of the set conditions thereof.

In such a highly stable crystal oscillator as to use an AGC circuit, the aging characteristic especially poses a problem. In order to obtain a favorable aging characteristic, circuit constants are set so as to keep the level of the excitation current of the crystal resonator at a low level.

That is, the excitation current of the crystal resonator is kept at a low level by making the base bias current of the transistor 103 small and holding down the gain of the transistor 103 to a low value.

If the transistor 103 is driven with a low base bias current, however, then the collector current necessarily becomes low. As evident from a relationship between the collector current and the noise figure shown in FIG. 4, therefore, there is a problem that the noise figure becomes high.

In other words, it is necessary to set the collector current to a value of a point B for making the noise figure low. For increasing the collector current, however, the base bias current must be increased. As a result, the gain of the transistor 103 becomes larger than need be. The excitation current level of the crystal resonator thus becomes high. Accordingly, a favorable aging characteristic cannot be obtained.

In the conventional crystal oscillator, therefore, the aging characteristic is given priority and the collector current is set to a value of a point A having an extremely low collector current. Thus, the rise of the noise figure is ignored.

An object of the present invention is to provide a crystal oscillator capable of having a favorable aging characteristic and improved in noise characteristic.

SUMMARY OF THE INVENTION

In order to solve the problems, in accordance with a first aspect of the present invention, the above described object is achieved by a piezoelectric oscillator comprising: a Colpitts oscillator including a piezoelectric resonator and an oscillation transistor; amplification means for amplifying an output of the Colpitts oscillator; and rectification means for rectifying an output of the amplification means, an output of the rectification means being fed back to base of the oscillation transistor to keep an oscillation output level constant, in which a base bias is set so as to provide the oscillation transistor with an operation point located in the vicinity of a saturation region, and in which a feedback current from the rectification means is supplied to the base of the oscillation resistor so as to make the operation point approach to the saturation region when the saturation output level has become high and so as to make the operation point go away from the saturation region when the oscillation output level has become low.

In accordance with a second aspect of the present invention, the above described object is achieved by a piezoelectric oscillator comprising: a Colpitts oscillator including a piezoelectric resonator and an oscillation transistor; amplification means for amplifying an output of the Colpitts oscillator; and rectification means for rectifying an output of the amplification means, an output of the rectification means being fed back to base of the oscillation transistor to keep an oscillation output level constant, in which base of a second transistor included in the amplification means is connected to ground in an alternating current manner, in which collector of the oscillation transistor is connected to emitter of the second transistor, and in which collector of the second transistor is connected to power supply.

In accordance with a third aspect of the present invention, the above described object is achieved by a piezoelectric oscillator comprising: a Colpitts oscillator including a piezoelectric resonator and an oscillation transistor; a second transistor for amplifying an output of the Colpitts oscillator; and rectification means for rectifying an output of the second transistor, an output of the rectification means being fed back to base of the second transistor to keep an oscillation output level constant, in which collector of the second transistor is set so as to provide the oscillation transistor with an operation point located in the vicinity of a saturation region, and in which a feedback current from the rectification means is supplied to the base of the second resistor so as to lower a base bias voltage of the second transistor and thereby make the operation point approach to the saturation region when the saturation output level has become high and so as to raise the base bias voltage of the second transistor and thereby make the operation point go away from the saturation region when the oscillation output level has become low.

In accordance with a fourth aspect of the present invention, the above described object is achieved by a piezoelectric oscillator comprising: a Colpitts oscillator including a piezoelectric resonator and an oscillation transistor; amplification means for amplifying an output of the Colpitts oscillator; and rectification means for rectifying an output of the amplification means, an output of the rectification means being fed back to base of the oscillation transistor to keep an oscillation output level constant, in which base of the second transistor is connected to ground in an alternating current manner, in which collector of the oscillation transistor is connected to emitter of the second transistor, and in which collector of the second transistor is connected to power supply.

In accordance with a fifth aspect of the present invention, the above described object is achieved by a piezoelectric oscillator according to any one of the second to fourth aspects of the present invention, in which a collector current of the second transistor is set so as to provide a noise figure of the oscillation transistor with a value located in the vicinity of a minimum value.

By the virtue of the configuration heretofore described, the collector current of the oscillation transistor of the oscillation circuit depends upon only setting of the collector current of the second transistor amplifier, and does not depend upon the base current of the oscillation transistor. Accordingly, set conditions of a wide range are obtained. As a result, operation under an operation condition of small noise figure becomes possible.

DETAILED DESCRIPTION OF THE PREFERRED EMBODIMENTS

Hereafter, the present invention will be described in detail by referring to an illustrated embodiment.

Figure 1:
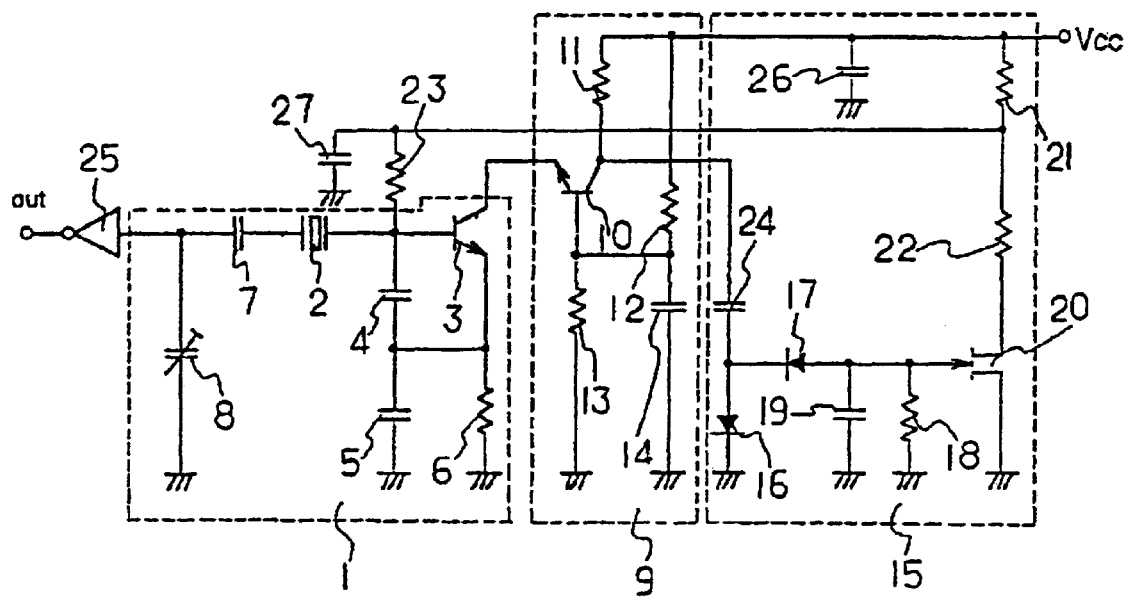
FIG. 1 is a circuit diagram of an embodiment of a crystal oscillator according to the present invention.

FIG. 1 is a circuit diagram showing an embodiment of a crystal oscillator according to the present invention.

In FIG. 1, a circuit 1 surrounded by a broken line is a typical Colpitts oscillation circuit. A crystal resonator 2 is connected to base of a transistor 3. The base of the transistor 3 is connected to its emitter via a capacitor 4. The emitter of the transistor 3 is connected to ground via a parallel circuit of a capacitor 5 and a resistor 6. Furthermore, one terminal of the crystal resonator 2 is connected to ground via a series circuit of a capacitor 7 and a trimmer capacitor 8.

Incidentally, oscillation output is taken out from ends of the trimmer capacitor 8.

An amplification circuit 9 surrounded by a broken line in FIG. 1 forms a part of an AGC circuit in conjunction with a rectification circuit described later. Emitter of a transistor 10 is connected to collector of the transistor 3. In addition, collector of the transistor 10 is connected to a power supply Vcc via a resistor 11. Base of the transistor 10 is connected to the power supply Vcc via a resistor 12. Furthermore, the base of the transistor 10 is connected to ground via a parallel circuit of a resistor 13 and a capacitor 14.

Furthermore, a circuit 15 surrounded by a broken line of FIG. 1 is the above described rectification circuit. Cathode of the diode 16 is connected to ground, and anode of the diode 16 is connected to cathode of a diode 17. Anode of the diode 17 is connected to ground via a parallel circuit of a resistor 18 and a capacitor 19. In addition, gate of a FET 20 having source connected to ground is connected to the anode of the diode 17. Furthermore, drain of the FET 20 is connected to the power supply via a series circuit of a resistor 21 and a resistor 22. In addition, a connection point of the resistor 21 and the resistor 22 is connected to the base of the transistor 3 via a resistor 23. The cathode of the diode 17 is connected to the collector of the transistor 10 via a capacitor 24.

Incidentally, capacitors 26 and 27 are bypass capacitors.

Operation of the crystal oscillator having such a configuration will now be described.

The transistor 3 of the oscillation circuit 1 is connected to the transistor 10 in a cascade form. Since the value of the collector current of the transistor 3 depends upon only the set value of the collector current of the transistor 10, it is possible to determine the value of the collector current of the transistor 3 on the basis of set conditions of a wide range, without being affected by the base current of the transistor 3.

A desired output signal generated from the collector of the transistor 3 on the basis of the parameters of the oscillation circuit 1 is supplied to the amplification circuit 9, amplified therein to a required level, then generated from the collector of the transistor 10, and supplied to the rectification circuit 15 via the capacitor 24.

During half a cycle of plus side of the output signal supplied to the rectification circuit 15, the output signal passes through the diode 16. At this time, the capacitor 24 is charged so that the anode side of the diode 16 will have a lower potential. During an opposite half cycle of minus side of the output signal, the signal flows through the diode 17. As a result, a potential of negative polarity, which becomes the sum of the potential generated by the signal during the half cycle of minus side and the potential generated by the charged electric charge of the capacitor 24, occurs between the anode of the diode 17 and the ground.

In the case where the level of the excitation current becomes high, the absolute value of the potential of negative polarity increases. As a result, a voltage drop is generated between the gate and the source of the FET 20, and consequently the drain current decreases. As a result, since the base bias voltage of the transistor 3 rises, therefore, the base current increases, and the emitter voltage rises, and the voltage between the base and collector of the transistor 3 decreases.

Since emitter of the transistor 10 is connected to collector of the transistor 3, the collector voltage of the transistor 3 is regulated below the voltage of the power supply Vcc. On the other hand, the base voltage of the transistor 3 is set equal to the voltage of the power supply Vcc. As a result, it is possible to set the operation point of the transistor 3 approaching to the saturation region when the collector current of the transistor 3 is set to a point B illustrated in FIG. 4. As the transistor 3 is used under the condition of the saturation, consequently the excitation level of the crystal resonator 2 falls. Therefore, it is possible to keep the collector current of the transistor 3 at a large current and set the transistor 3 at an operation point minimizing the noise figure and keep an excellent aging characteristic.

When the base voltage of the transistor 3 becomes high level, the saturated level of the excitation signal is increased; therefore, amplitude of the excitation signal is suppressed by the AGC function.

Incidentally, the change of the excitation current proportional to the change of the base voltage of the transistor 3 becomes dull since the operation point of the transistor 3 approaching to the saturation region. However, this defects is made up by the AGC circuit since the output of the AGC circuit is amplified by the FET 20.

On the other hand, in the case where the level of the output signal of the oscillation circuit 1 has fallen, operation opposite to the above-described operation is caused. Therefore, description of its operation will be omitted. By conducting the above-described operation repetitively, therefore, the crystal oscillator outputs a stable level signal on the basis of set conditions thereof.

Figure 2:
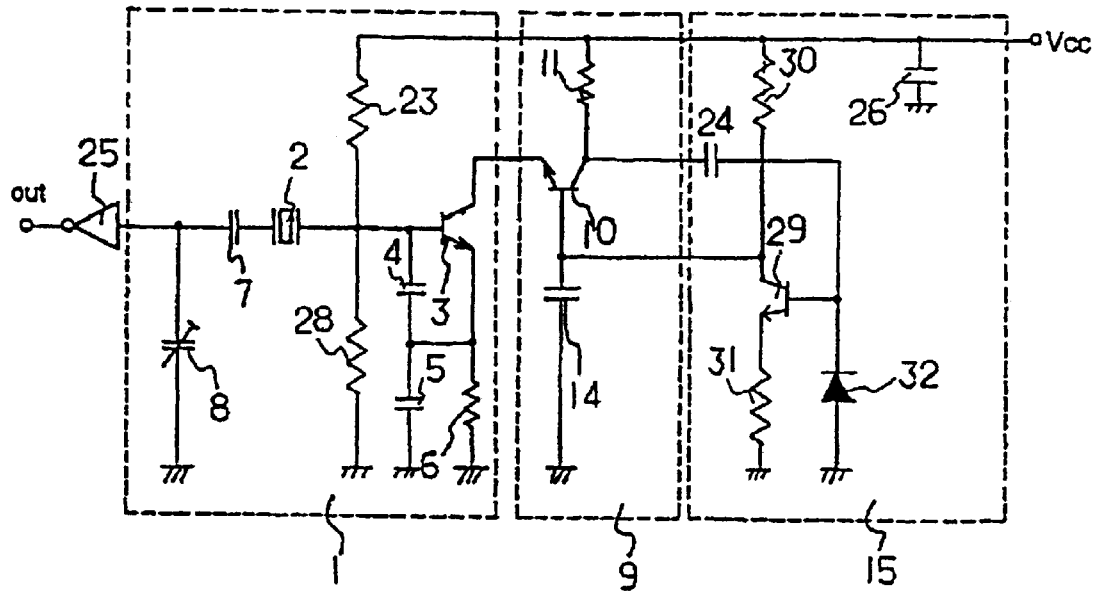
FIG. 2 is a circuit diagram of another embodiment of a crystal oscillator according to the present invention.
Figure 3:
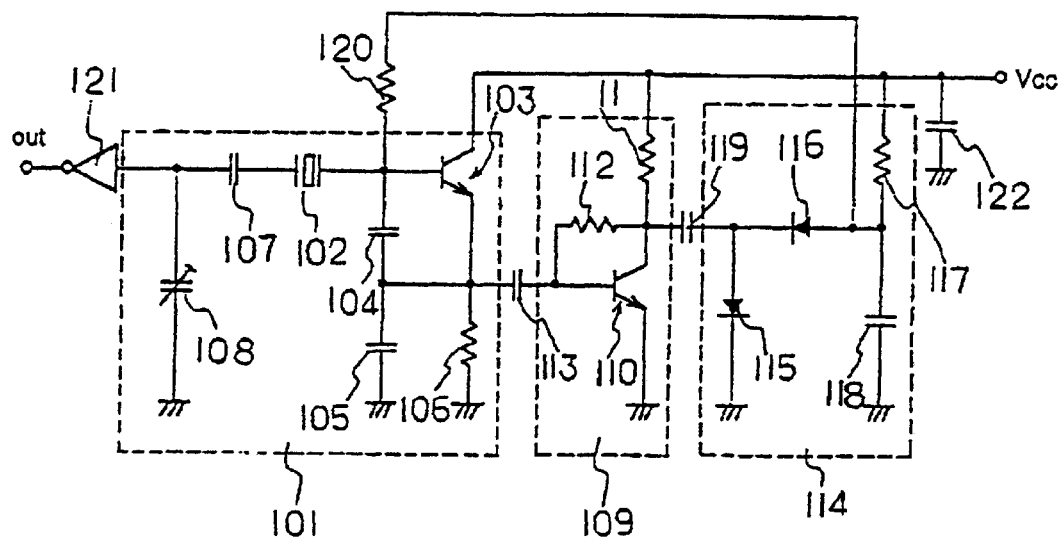
FIG. 3 is a circuit diagram of a conventional crystal oscillator.

Furthermore, a circuit shown in FIG. 2 is another embodiment of a crystal oscillator circuit according to the present invention. The configuration and operation of the crystal oscillator will hereafter be described.

Portions of the crystal oscillator of FIG. 2 having the same configuration as those of the crystal oscillator shown in FIG. 1 are denoted by like reference numerals. Description thereof will be omitted.

The oscillation circuit 1 is formed so that a base circuit composed of the resistor 23 and a resistor 28 is connected to the transistor 3. The amplification circuit 9 is formed so as to connect the base of the transistor 10 to ground via a capacitor 14. The rectification circuit 15 is formed so that collector of a transistor 29 is connected to the power supply Vcc via a resistor 30. Emitter of the transistor 29 is connected to ground via a resistor 31. Furthermore, base of the transistor 29 is connected to collector of the transistor 10 via the capacitor 24. In addition, a diode 32 is connected between the base of the transistor 29 and the ground so that cathode of the diode 32 will be connected to the base side of the diode 32.

The output signal produced by the oscillation circuit 1 having such a configuration is supplied to the rectification circuit 15 via the amplification circuit 9. Thereafter, only a signal component of the plus half cycle of the output signal is converted to a direct signal by the rectification circuit 15 and fed back to the base of the transistor 10.

The transistor 29 produces an output inverted in phase with respect to its input. In the case where the level of the output signal rises, therefore, a direct current voltage supplied from the rectification circuit 15 to the base of the transistor 10 falls. Furthermore, as the base potential falls, a collector voltage of the transistor 10 falls.

The operation point of the transistor 10 is set in the vicinity of a saturation region beforehand so that a part of the signal will arrive at the saturation region. When the collector voltage of the transistor 10 falls, therefore, the operation point of the transistor 3 approaches to the saturation region, and consequently the excitation level falls.

On the other hand, in the case where the output level has fallen, operation opposite to the above-described operation is caused. Therefore, description of its operation will be omitted.

By virtue of the above described configuration, it is possible to let flow a large collector current through the transistor 3 even if control is effected so as to keep the excitation current at a low level.

Figure 4:
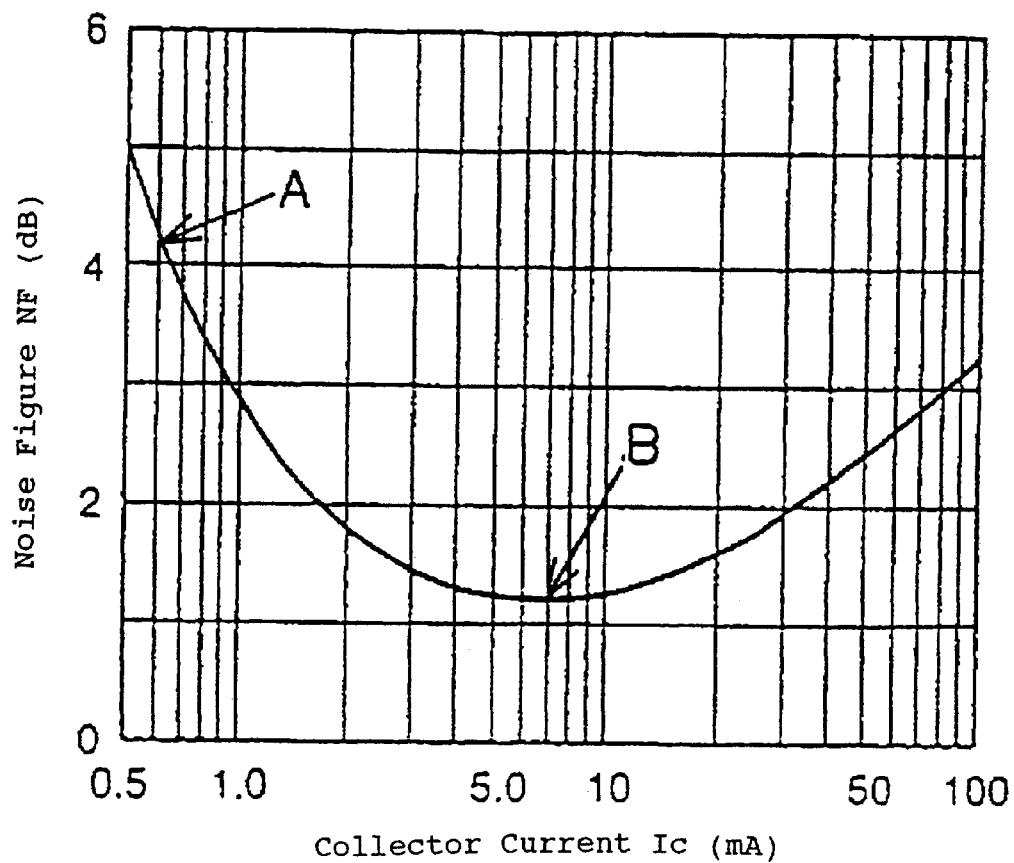
FIG. 4 is a graph showing a noise figure characteristic as a function of a collector current of a transistor.

It is now assumed that a transistor having a noise figure, for example, as shown in FIG. 4 is used. The collector current of the transistor 3 is set so as to assume a value located in the vicinity of a point B in FIG. 4 minimizing the noise by using the transistor 10 and the circuit located around it. As a result, a sufficiently excellent characteristic is obtained. Furthermore, the point B is a minimum value as evident from FIG. 4, even if the collector current is changed by the AGC function; therefore, the change value of the noise figure is small. As a result, a sudden aggravation of the noise characteristic is not caused.

As heretofore described, the crystal oscillator is formed by using a Colpitts oscillation circuit as a fundamental oscillation circuit in an embodiment of the present invention. However, the present invention is not limited to this. The crystal oscillator may be formed by using an overtone oscillation circuit.

Furthermore, while the present invention has been described by taking an oscillator using a crystal resonator as an example, the present invention is not limited to this. It is evident that the present invention may be applied to oscillators using a piezoelectric resonator other than the crystal resonator.

As heretofore described, the piezoelectric oscillator according to the present invention is formed as described above. Even in the case where control is effected so as to keep the excitation current at a low level, it becomes possible to keep the collector current of the transistor at a large current and set the transistor at an operation point minimizing the noise figure. This results in an effect that a piezoelectric oscillator, which is excellent in both noise characteristic and aging characteristic, is realized.

What is claimed is:

1. A piezoelectric oscillator comprising:

a Colpitts oscillator including a piezoelectric resonator and an oscillation transistor;

amplification means for amplifying an output of said Colpitts oscillator; and rectification means for rectifying an output of said amplification means, an output of said rectification means being fed back to base of said oscillation transistor to keep an oscillation output level constant, wherein a base bias is set so as to provide said oscillation transistor with an operation point located in the vicinity of a saturation region, and wherein a feedback current from the rectification means is supplied to the base of the oscillation resistor so as to make the operation point approach to the saturation region when the saturation output level has become high and so as to make the operation point go away from the saturation region when the oscillation output level has become low.

2. A piezoelectric oscillator comprising, a Colpitts oscillator including a piezoelectric resonator and an oscillation transistor;

amplification means for amplifying an output of said Colpitts oscillator; and rectification means for rectifying an output of said amplification means, an output of said rectification means being fed back to base of said oscillation transistor to keep an oscillation output level constant, wherein base of a second transistor included in said amplification means is connected to ground in an alternating current manner, wherein collector of said oscillation transistor is connected to emitter of the second transistor, and wherein collector of the second transistor is connected to power supply.

3. A piezoelectric oscillator according to claim 2, wherein a collector current of said second transistor is set so as to provide a noise figure of said oscillation transistor with a value located in the vicinity of a minimum value.

4. A piezoelectric oscillator comprising:

a Colpitts oscillator including a piezoelectric resonator and an oscillation transistor;

a second transistor for amplifying an output of the Colpitts oscillator; and rectification means for rectifying an output of said second transistor, an output of said rectification means being fed back to base of said second transistor to keep an oscillation output level constant, wherein collector voltage of the second transistor is set so as to provide said oscillation transistor with an operation point located in the vicinity of a saturation region, and wherein a feedback current from said rectification means is supplied to the base of said second resistor such that a base bias voltage of said second resistor lowers and the operation point of said oscillation transistor approaches to the saturation region when the oscillation output level has become high, while the base bias voltage of said second resistor rises and the operation point of the oscillation transistor goes away from the saturation region when the oscillation output level has become low.

5. A piezoelectric oscillator according to claim 4, wherein a collector current of said second transistor is set so as to provide a noise figure of said oscillation transistor with a value located in the vicinity of a minimum value.

6. A piezoelectric oscillator comprising, a Colpitts oscillator including a piezoelectric resonator and an oscillation transistor;

a second transistor for amplifying an output of the Colpitts oscillator; and rectification means for rectifying an output of said second transistor, an output of said rectification means being fed back to base of said oscillation transistor to keep an oscillation output level constant, wherein base of said second transistor is connected to ground in an alternating current manner, wherein collector of said oscillation transistor is connected to emitter of the second transistor, and wherein collector of said oscillation transistor and emitter of said second transistor are connected to each other, and collector of the second transistor is connected to power supply.

7. A piezoelectric oscillator according to claim 6, wherein a collector current of said second transistor is set so as to provide a noise figure of said oscillation transistor with a value located in the vicinity of a minimum value.

* * * * *